US005635892A

United States Patent [19]

Ashby et al.

[11] Patent Number: 5,635,892

[45] Date of Patent: Jun. 3, 1997

[54] HIGH Q INTEGRATED INDUCTOR

[75] Inventors: Kirk B. Ashby, Muhlenberg Township; Iconomos A. Koullias, Berks, both of Pa.

[73] Assignee: Lucent Technologies Inc., Murray Hill, N.J.

[21] Appl. No.: 350,358

[22] Filed: Dec. 6, 1994

[51] Int. Cl.[6] .................... H01L 27/02

[52] U.S. Cl. .................... 336/200; 336/183; 336/232

[58] Field of Search .................... 336/200, 183, 336/232

[56] References Cited

U.S. PATENT DOCUMENTS

| | | | |
|---|---|---|---|
| 4,979,016 | 12/1990 | Lee | 357/70 |
| 5,027,255 | 6/1991 | Zeitlin et al. | 361/395 |
| 5,095,357 | 3/1992 | Andoh | 336/200 |
| 5,206,623 | 4/1993 | Rochette et al. | 338/203 |
| 5,225,969 | 7/1993 | Takaya et al. | 361/414 |
| 5,233,310 | 8/1993 | Inoue | 330/277 |
| 5,243,319 | 9/1993 | Brokaw | 338/195 |

OTHER PUBLICATIONS

J. Y. C. Change et al. "Large Suspended Inductors on Silicon and Their Use in a 2-μm CMOS RF Amplifier", IEEE Electron Device Letters, vol. 14. No. 5, May 1993, pp. 246–248.

K.B. Ashby, W.C. Finley, J.J. Bastek, S. Moinian and I.A. Koullias, "High Q Inductors For Wireless Applications In a Complementary Silicon Bipolar Process", 1994 Bipolar/BiCMOS Circuits & Technology Meeting, pp. 179–182.

*Primary Examiner*—Cassandra C. Spyrou
*Assistant Examiner*—G. R. Lord

[57] ABSTRACT

An inductive structure is provided which displays an increased self-inductance and improved Q at high frequencies. The improvement resides in the disposition proximate the inductive structure an amount of magnetic material to increase mutual inductance between adjacent portions of the inductor's conductive path with current flow.

19 Claims, 4 Drawing Sheets

$$L = \sum_{n=1}^{12} \ell_i$$

HIGH Q INTEGRATED INDUCTOR

BACKGROUND

1. Field of the Invention

The present invention relates to inductors for use in high frequency integrated circuits.

2. Description of the Related Art

Series resistance is inherent within inductive structures. Series resistance within inductive structures formed by a silicon process dominates the losses occurring during operation as the frequency of operation increases. The losses reduce the inductor's quality factor Q, the ratio of reactance to series resistance within the inductor (when the inductive structure is modeled using a certain topology). Reducing or minimizing the increasing series resistance with increasing frequency, with its concomitant effect on the inductor's Q, is accomplished by increasing the cross-sectional area for current flow within the inductor. Increasing the cross-sectional area may be accomplished by increasing the metallization width or thickness, or both, of the conductive path forming the inductor.

An improved Q displayed by an inductor as a function of increased width W or depth D is substantially linear at DC to the lower frequencies. As the frequency of operation increases, however, current flow through the entire cross-sectional area of the inductor's conductive path, tends to drop off. The current thereafter tends to flow at the outer cross-sectional edges (i.e., perimeters) of the cross-section of the inductor, such as L10 depicted in FIG. 1A. Such current flow is in accordance with the so-called "skin-effect" theory.

Inductors formed for use within integrated circuits are typically spiral-shaped. FIG. 1B shows a portion of a conventional spiral inductor, L20, formed with an aluminum conductor 24 on a silicon substrate 22. FIG. 1C shows a cross-sectional portion of the conductive path of conductor 24. W and L represent the conductor's width and length, respectively, and D represents its depth. L is the summation of individual lengths $1_1, 1_2 \ldots 1_n$, comprising the inductor's conductive path. Because the conductive path is spiral-shaped (although not clear from the cross-sectional view in the figure), magnetic fields induced by current flow tend to force the current to flow along the inner or shorter edges of the spiral conductive path (shown hatched). Because of these "edge effects", increasing the width W beyond a particular point (and therefore the cross-sectional area), as mentioned above, ceases to show a concomitant improvement in the inductor's Q with increasing frequency. The thickness or depth D of the conductive path must be increased, or the magnetic coupling between adjacent turns must be increased, to provide the required Q.

SUMMARY OF THE INVENTION

The present invention provides an inductor fabricated for semiconductor use which displays an increased self-inductance and improved Q not realizable with conventional integrated inductor fabrication techniques. Consequently, inductors formed in accordance with this invention may be utilized within a frequency range of around 100 MHz to substantially beyond 10 GHz. During operation, inductive structures of this invention display Q's in a range of around 2 to around 15.

For an inductive structure formed as a spiral with a particular number of turns N, the addition of the core of magnetic material described herein results in a higher inductance for the structure. To put it another way, a reduced number of turns may be used within an inductive structure of this invention, relative an inductive structure of the prior art, and derive a similar inductance value. Because fewer turns are used within a structure formed in accordance with the present invention, the parasitic capacitance in the structure will be lower.

In one form, the mutual inductance between adjacent metal runners forming the conductive path of an inductive structure is increased. Additionally, the series resistance displayed by the conductive path remains fixed, i.e., does not degrade substantially with increasing frequency. This provides for stable or improved Q values with varying frequency. The structural arrangement includes the deposition of a portion, preferably a plane, of high permeability magnetic material above the metal runners forming the inductor's conductive path.

The layer of magnetic material is further arranged to provide a low reluctance path and to maximize magnetic coupling between path elements while providing a high resistance path to eddy currents induced in the core. The arrangement maximizes the inductance of the structure while minimizing eddy current losses induced in the core which degrade the inductor's Q. Preferably, the high permeability magnetic material does not have any electrical connections to the integrated circuitry of which the inductive structure is a part. The process of providing the layer of high permeability magnetic material is believed compatible with the existing silicon manufacturing processes.

DETAILED DESCRIPTION OF THE PREFERRED EMBODIMENTS

The inductive structure of this invention is provided for use within high frequency semiconductor integrated circuits. The inductive structure displays an improved inductance for a fixed value of series resistance inherent within the conductive path forming the inductor. The improved inductance leads to a realization of quality factor (Q) for the invention between values of 10 to 16 at very high frequencies, unrealizable within the prior art. The range of operation of inductors formed as described herein extends from around 100 MHz to around 10 GHz.

Figure 1A:
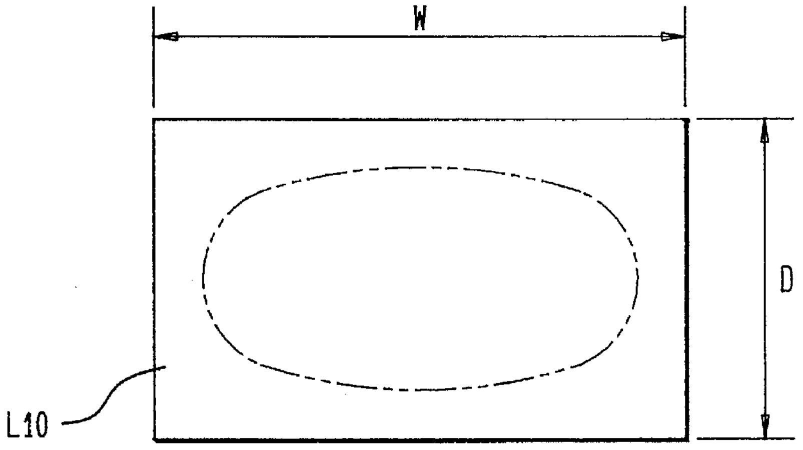
FIG. 1A is a cross-section of a rectangular conductor of the prior
Figure 1B:
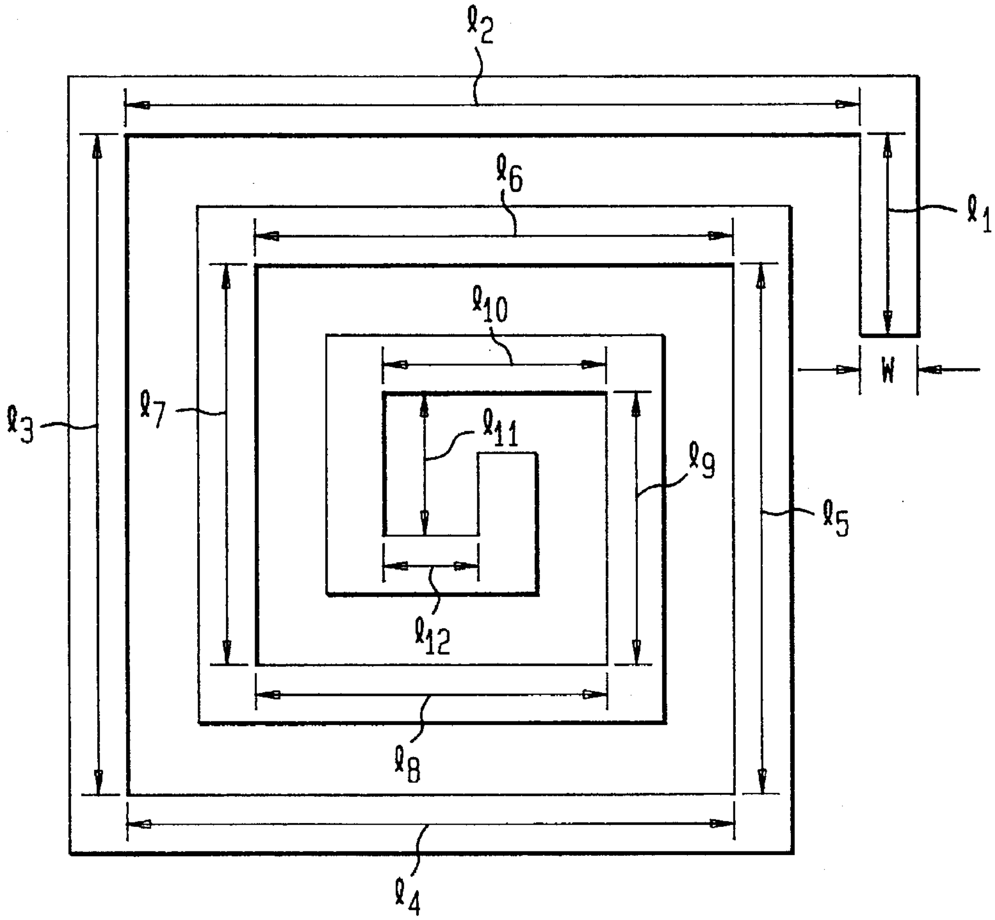
FIG. 1B is plan view of a portion of a spiral inductor formed with conventional silicon fabrication techniques.
Figure 1C:
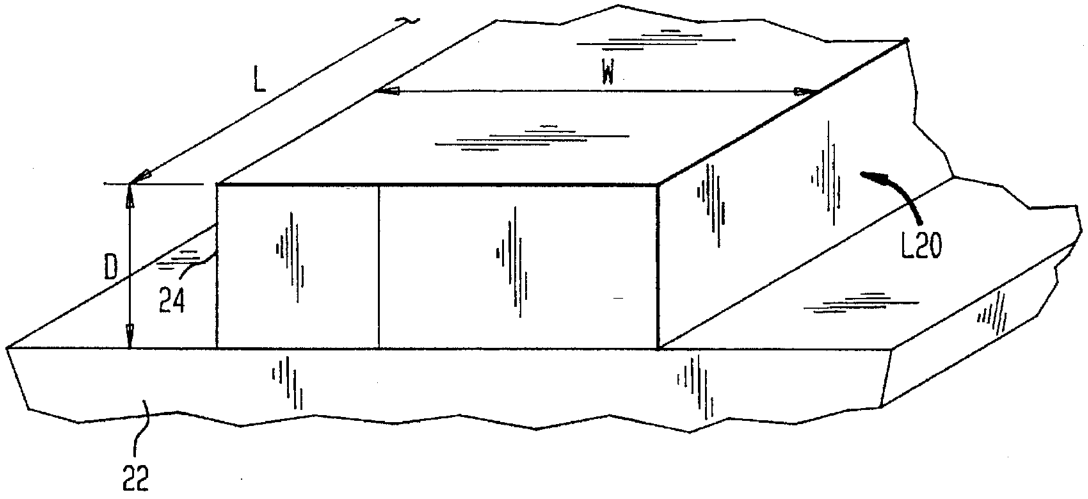
FIG. 1C is cross-sectional view of a portion of conductive path forming a spiral inductor via conventional fabrication techniques.
Figure 2A:
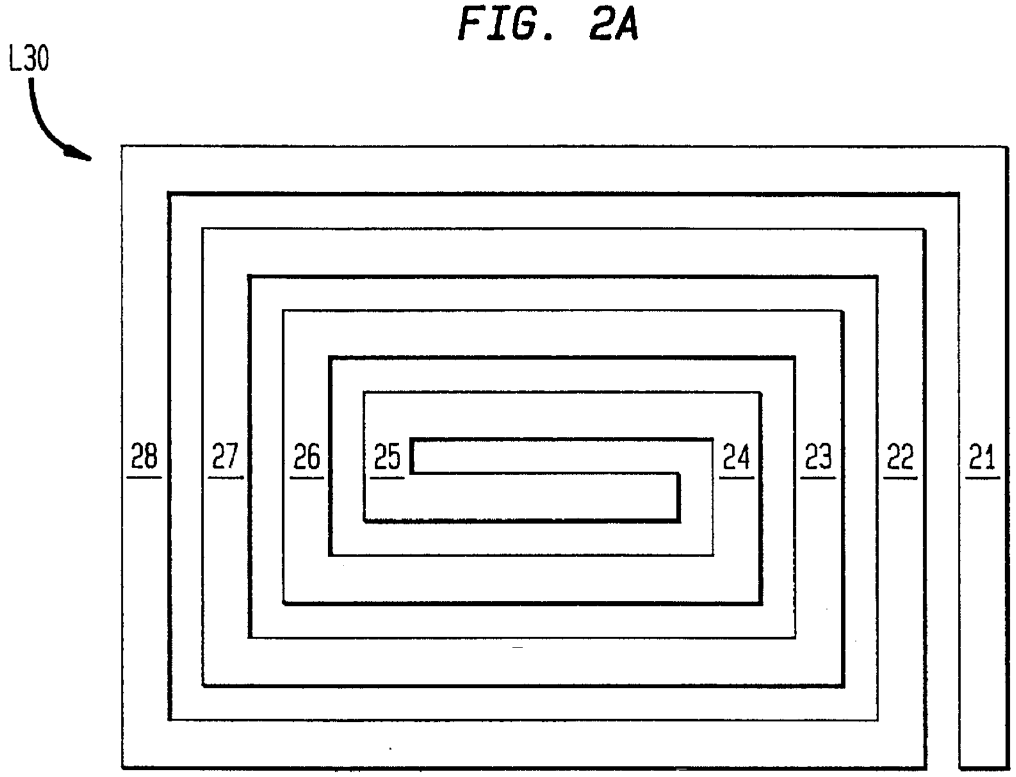
FIG. 2A is a plan view of a spiral integrated inductive structure of this invention.
Figure 2B:
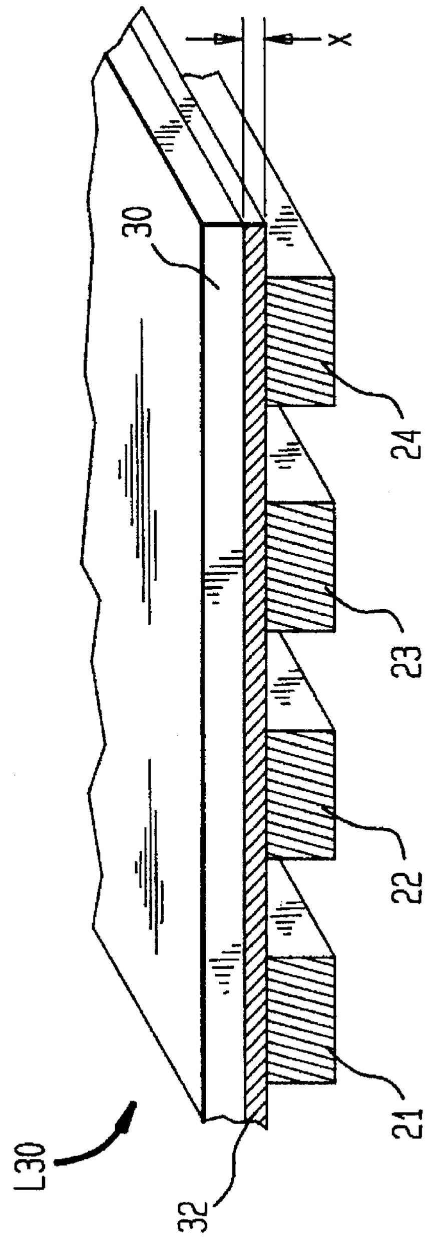
FIG. 2B and 2C are a cross-sectional view of a portion of the spiral conductor of FIG. 2A.

FIGS. 2A and 2B show spiral and cross-sectional portions, respectively, of several conductive elements 21, 22, 23, 24, 25 forming a spiral conductive path of an inductive structure L30 of this invention. The conductive paths may be disposed on or within a substrate material such as a semiconductor material or a dielectric material. An example of a nonconductive substrate is gallium arsenide (GaAs), usually described as semi-insulating.

A portion of high magnetic permeability material 30 is disposed at a distance X from the conductive path elements and separated therefrom by a layer of dielectric material 32. The high permeability magnetic material is preferably planar-shaped and provides a low reluctance path which raises the mutual inductance induced between adjacent runners with current flow. As is clear from the figures, the high magnetic permeability material is not electrically connected to any portion of the circuitry contained within the integrated circuit.

Use of the plane of high magnetic permeability material 30 (plane or core), as described above, is beneficial but does introduce a complication within the semiconductor circuit. Eddy currents are generated within the magnetic material which deplete energy as heat loss. Eddy currents are induced when a changing flux passes through a solid magnetic mass, such as iron, from which the layer 30 may be comprised.

Figure 2C:
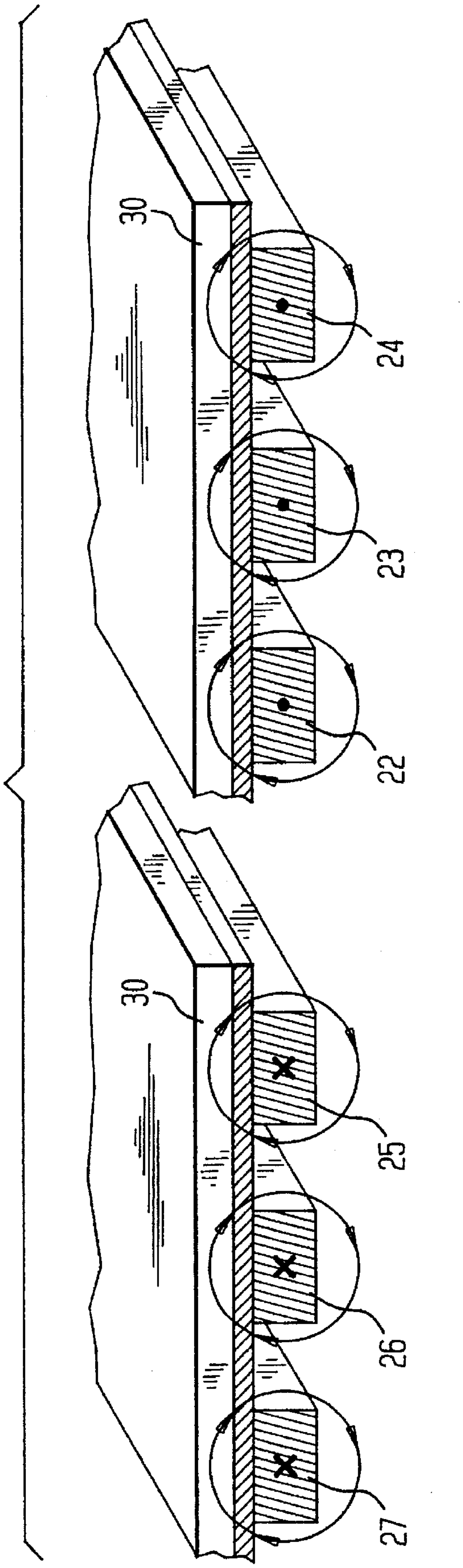

Referring now to FIG. 2C, alternating current, flowing into the plane of the paper on the right side of FIG. 2C (lands 22–24), and out of the plane of the paper on the left (lands 25–27), generate a changing magnetic flux affecting core 30. The flux fields are identified by the circular arrows, identifying flux direction. The flux induces a current in the magnetic material (core 30) commensurate with the induced flux.

When changing magnetic flux densities are high, eddy currents are responsible for significant power loss. Eddy current loss is related to the square of the frequency and the square of the maximum flux density.

Figure 3A:
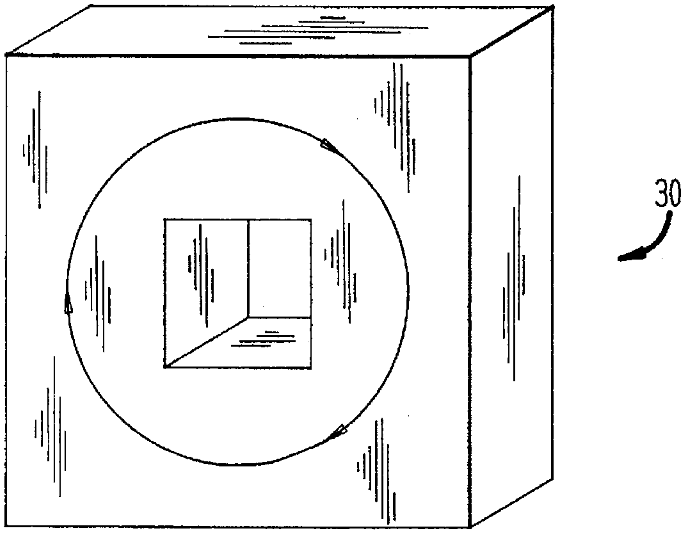
FIGS. 3A, 3B and 3C are plan views of various forms of planes of high permeability magnetic material included within the present invention.
Figure 3B:
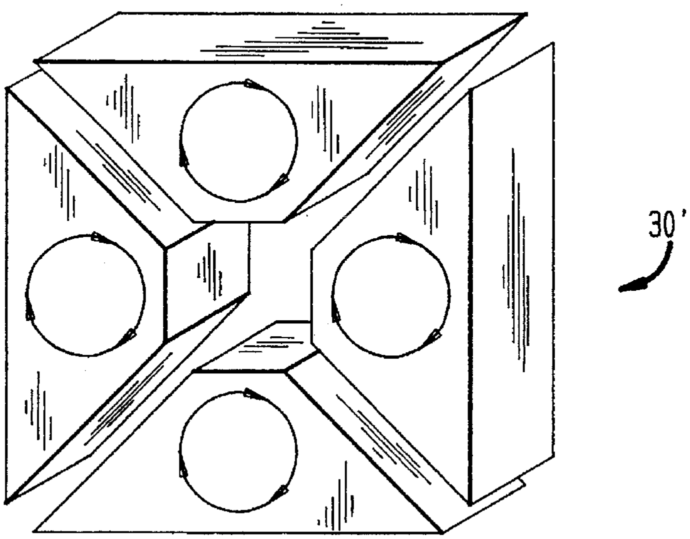
Figure 3C:
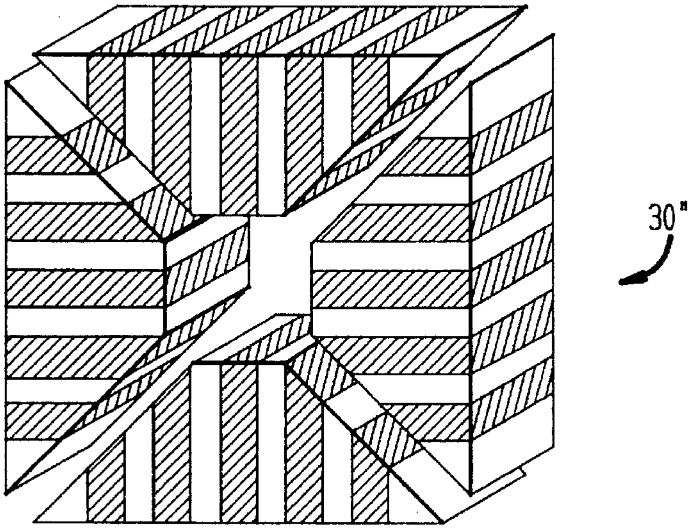

To minimize eddy currents in iron-core transformers (and the loss associated therewith), the core is formed of blocks or sheets of laminate disposed parallel to the flux direction. As shown in FIGS. 3A, 3B and 3C, a changing applied flux (directed into or out of the plane of the paper, relative the central hole) induces a net current within the planes of core material 30. The induced current flow is indicated with the circular arrows. Consequently, the induced eddy current produces a time-changing flux (directed out of the plane of the paper) in opposition to the changing applied flux, thereby reducing the total time changing applied flux through the core. Eddy currents are induced perpendicular to the direction of the changing flux. Accordingly, the induced eddy currents may be minimized by breaking-up the core into thin sections or sheets. Accordingly, the circulating eddy current paths are limited, resulting in reduced eddy current losses within the total mass of magnetic material.

The shape of the planar core 30 shown in FIG. 3A includes a rectangular hole substantially at its center. The rectangular hole reduces undesired magnetic coupling between runners on opposite sides of the inductor relative the center. The design, however, does not address problems associated with the generation of eddy currents. FIG. 3B, shows core 30' which is the core (i.e., the planar core of the preferred embodiment) broken up into wedges and including the hole in the center for the reasons discussed above. This design reduces both unwanted coupling and eddy current loss with respect to the design of FIG. 3A. FIG. 3C shows the use of multiple strips of magnetic material to form the planar core 30". Such design further reduces eddy current loss relative to the design of FIG. 3B. The strips of magnetic material are preferably at right angles (orthogonal) to the lines formed by the metal runners forming the inductor's conductive path.

What has been described herein is merely illustrative of the application of the principles of the present invention. Other arrangements and methods may implemented by those skilled in the art without departing from the spirit or scope of this invention.

What is claimed is:

1. An inductive structure formed within a substrate and integrable with a semiconductor integrated circuit, comprising:

a) an electrical conductor providing a conductive path formed as a spiral planar pattern upon said substrate; and b) a core of magnetic material in proximity to and facing said planar pattern, such core defining an opening in a central region thereof.

2. The inductive structure defined by claim 1, wherein said core has generally rectangular platform and includes four electrically isolated and segregated wedge portions, each wedge portion having a generally triangular platform such that said core defines diagonal openings extending between diagonally opening corners of the rectangular platform.

3. The inductive structure defined by claim 2, wherein said wedge portions each comprise multiple strips of magnetic material.

4. The inductive structure defined by claim 3, wherein said multiple strips disposed substantially at right angles to substantially adjacent lengths of said conductive path.

5. The inductive structure defined by claim 1, wherein said core is planar.

6. The inductive structure defined by claim 1, further including a layer of dielectric material disposed between said pattern and said core to electrically isolate said pattern from said core.

7. The inductive structure defined by claim 1, wherein said substrate is comprised of a material selected from the group consisting of a semiconductor and a dielectric material.

8. The circuit defined by claim 7, wherein said pattern and said core are positioned to provide high frequency operation.

9. The inductive structure defined by claim 1, wherein said pattern and said core are positioned to provide high frequency operation to around 12 GHz.

10. The inductive structure defined by claim 1, wherein adjacent lengths of said spiral planar pattern are substantially parallel.

11. A semiconductor integrated circuit comprising a substrate and an inductive structure, said inductive structure further comprising:

a) an electrical conductor providing a conductive path in a form of a spiral planar pattern on said substrate; and b) a core of magnetic material in proximity to and facing said planar pattern, said core defining an opening in a central region thereof.

12. The circuit of claim 11, wherein said core has a generally rectangular platform and includes four electrically isolated and segregated wedge portions, each wedge portion having a generally triangular platform such that said core defines diagonal openings extending between diagonally opposing corners of the rectangular platform.

13. The circuit of claim 12, wherein said wedge portions each comprise multiple strips of magnetic material.

14. The circuit of claim 13, wherein said multiple strips are disposed substantially at right angles to substantially adjacent lengths of said conductive path.

15. The circuit defined by claim 11, wherein said core is planar.

16. The circuit defined by claim 11, further including a layer of dielectric material disposed between said pattern and said core to electrically isolate said pattern from said core.

17. The circuit defined by claim 11, wherein said substrate is comprised of a material selected from the group consisting of a semiconductor and a dielectric material.

18. The circuit defined by claim 11, wherein said pattern and said core are positioned to provide high frequency operation to around 12 GHz.

19. The circuit defined by claim 11, wherein adjacent lengths of said spiral planar pattern are substantially parallel.

* * * * *